US008468477B2

(12) United States Patent
Ren

(10) Patent No.: US 8,468,477 B2
(45) Date of Patent: Jun. 18, 2013

(54) LOGIC MODIFICATION SYNTHESIS FOR HIGH PERFORMANCE CIRCUITS

(75) Inventor: Haoxing Ren, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 55 days.

(21) Appl. No.: 13/096,361

(22) Filed: Apr. 28, 2011

(65) Prior Publication Data

US 2012/0278771 A1 Nov. 1, 2012

(51) Int. Cl.
*G06F 17/50* (2006.01)
(52) U.S. Cl.
USPC ............ 716/104; 716/101; 716/102; 716/139
(58) Field of Classification Search
USPC ......................................................... 716/102
See application file for complete search history.

(56) References Cited

U.S. PATENT DOCUMENTS

| 6,260,177 | B1 | 7/2001 | Lee | 716/121 |
|---|---|---|---|---|
| 6,490,717 | B1 * | 12/2002 | Pedersen et al. | 716/104 |
| 7,290,240 | B1 * | 10/2007 | Lam-Leventis et al. | 716/104 |
| 7,530,046 | B1 * | 5/2009 | Nixon et al. | 716/103 |
| 2009/0119621 | A1 | 5/2009 | Cortadella | 716/134 |
| 2009/0178013 | A1 | 7/2009 | Wang | 716/132 |
| 2009/0254874 | A1 | 10/2009 | Bose | 716/113 |
| 2010/0017175 | A1 | 1/2010 | Moon | 703/2 |
| 2010/0281443 | A1 | 11/2010 | Lo | 716/136 |
| 2011/0004857 | A1 * | 1/2011 | Hopkins et al. | 716/104 |

FOREIGN PATENT DOCUMENTS

JP 2002-259477 9/2002

OTHER PUBLICATIONS

U.S. Appl. No. 12/862,838, filed May 25, 2010, Arbel.
S. Krishnaswamy, et al., "DeltaSyn: An Efficient Logic-Difference Optimizer for ECO Synthesis," proc. ICCAD 2009. pp. 789-796.
A. Ling, et al. "Towards Automated ECOs in FPGAs," proc. FPGA, 2009, pp. 3-12.
S. Safarpour, et al. "Improved Design Debugging Using Maximum Satisfiability," proc. FMCAD, 2007, pp. 13-19.
A. Smith, et al. "Design Diagnosis Using Boolean Satisfiablity," proc. ASPDAC 2004, pp. 218-223.
K-H. Chang, et al. "Fixing Design Errors with Counter-examples and Resynthesis," IEEE Trans. On CAD, vol. 27, No. 1, Jan. 2008, pp. 184-188.
C.-C. Lee, et al. "Scalable exploration of functional dependency by interpolation and incremental SAT solving," Proc. of the Intnatl. Conf. on Computer-Aided Design, 2007, pp. 227-233.

(Continued)

*Primary Examiner* — Nha Nguyen
*Assistant Examiner* — Bryce Aisaka
(74) *Attorney, Agent, or Firm* — George Sai-Halasz; Preston J. Young

(57) ABSTRACT

A method for IC modification is disclosed. The method recognizes an original HDL file prescribing an original logic, an original netlist incorporating the original logic, and a new HDL file prescribing a new logic. The new logic comprises desired logic changes relative to the original logic. If a signal is different between the new HDL file and the original HDL file the method adds a user hint to both the original HDL file and the new HDL file. Using the original HDL file, the original netlist, the new HDL file, and the user hints, the method synthesizes a delta netlist for inserting into the original netlist, whereupon this insertion the original netlist will incorporate the new logic.

7 Claims, 7 Drawing Sheets

OTHER PUBLICATIONS

C.-C. Lin, et al. "Logic Synthesis for Engineering Change" IEEE Trans. Computer-Aided Design of Integrated Circuits and Systems, vol. 18, No. 3, 1999, pp. 282-292.

D. Brand, et al. "Incremental Synthesis" ICCAD 1994, pp. 14-18.

B.-H. Wu, et. al. "A Robust Functional ECO Engine by SAT Proof Minimization and Interpolation Techniques" ICCAD 2010, pp. 729-734.

* cited by examiner

```
find_functional_correspondence( netlist A, netlist B)
{
    simulate A and record sig(i) on each net i
    create hash table for sig(i) on A
    connect primary inputs of A and B together
    simulate B and record sig(i) on each net i
    for each net i in B
        for each net j in A where sig(j)=sig(i) using hash table
            construct a SAT miter between i and j
            if (unsat) record functional correspondence (i==j) on i
}
```

FIG. 2

```
back_substitution( netlist A, netlist B, hints H)
{
    connect the primary inputs of A and B together
    for each hint net i of H in B
        find corresponding hint net j in A
        disconnect all the sinks of net j
        connect i to those sinks
    save A as SPEC netlist
}
```

FIG. 4

```
speculative_reduction (list of SPEC gates)
{
    for each gate g in topological order
        locate g's output net i
        find a list of recorded functionally corresponded net for i
        for each net j in the list
            build SAT miter between i and j
            if (sat) then   // i and j are not equivalent
                disconnect all the sinks of net j
                connect i to those sinks
                set Delta mark on the SPEC gates driving i
}
```

FIG. 7

LOGIC MODIFICATION SYNTHESIS FOR HIGH PERFORMANCE CIRCUITS

BACKGROUND

The present invention relates to integrated circuit (IC) design. In particular, it relates to making logic changes in an already implemented circuit.

It is known that in existing design flows a change in the logic specification, such as would be usual for an engineering change order (ECO), can lead to large changes in the implementation. There is a need for computer-aided design (CAD) methodologies to handle logic changes specified for an existing circuit, without restarting the entire design synthesis process.

BRIEF SUMMARY

A method is disclosed, which method recognizes an original hardware description language (HDL) file prescribing an original logic, and an original netlist incorporating the original logic. The method further recognizes a new HDL file prescribing a new logic. The new logic comprises a desired logic change relative to the original logic. The method adds a user hint to both the original HDL file and the new HDL file when one of the signals is different between the new HDL file and the original HDL file. Using the original HDL file, the original netlist, the new HDL file, and the user hint, the method synthesizes a delta netlist for inserting into the original netlist, whereupon this insertion the original netlist will incorporate the new logic.

BRIEF DESCRIPTION OF THE SEVERAL VIEWS OF THE DRAWINGS

These and other features of embodiments of the invention will become apparent from the accompanying detailed description and drawings, wherein:

FIG. 2 presents an algorithm in a representative embodiment of the disclosure for finding functional correspondence in netlists;

FIG. 4 presents an algorithm in a representative embodiment of the disclosure for back substituting user hints;

FIG. 7 presents an algorithm in a representative embodiment of the disclosure for the step of speculative reduction.

DETAILED DESCRIPTION

Figure 1:
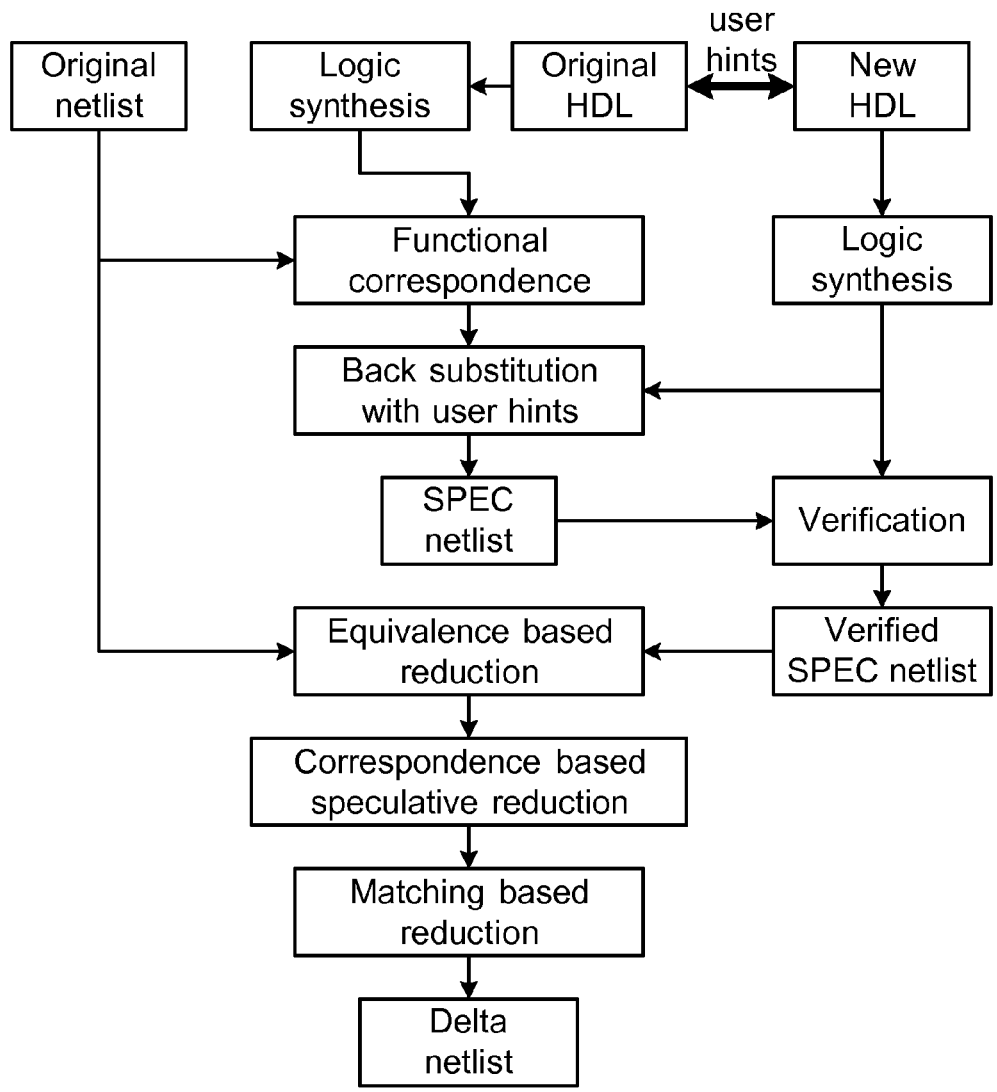
FIG. 1 shows a flowchart for a representative embodiment of the disclosure.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "logic," or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the description of the computer executable method and/or the flowcharts and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Integrated circuits (IC) at times may have to undergo modifications to their functional specification. Frequently, such modifications are expressed as an engineering change order (ECO). Often the needed modifications may be quite minor, incremental in nature. In spite of the modifications being relatively minor, possibly extending to only a small fraction of the logic functions of the IC, the logically modified IC is typically redone from the start, as it were a new design. Redesigning logic, however, may involve high costs in terms of design effort and time.

There are difficulties implementing functional changes incrementally into an existing IC design. IC logic design is a highly automated process, typically called computer aided design (CAD). During CAD, logic and physical optimizations may render intermediate signals in the IC unrecognizable, usually prohibiting simple manual repair of the existing logic. Also, there is an inherent randomness in automated optimization choices. This randomness may make the design process unstable, i.e., a slight modification of the specification can lead to a completely different implementation, one that is practically unrecognizable relative to the original IC.

There are several approaches in the art to deal with logic modifications without having to process the modification as a new logic, starting from the beginning There are two recent patent applications disclosing variations on a structure-matching based logic modification approach, by doing the structure matching in two phases. The first, an equivalence based reduction phase, matches structure and functional equivalent circuits on both original netlist and the new, or ECO, netlist, from the input side forward. The second, a matching based reduction phase, matches the two netlists from the output side backward using Boolean matching techniques, adopting SAT based equivalence checking The subject of the present application is related to these two commonly assigned applications: Ser. No. 12/497,499, filed Jul. 2, 2009, published US20110004857, Jan. 6, 2011, and Ser. No. 12/862,838, filed Aug. 25, 2010, both of which applications are incorporated herein by reference in their entirety. The logic modification synthesis tool which is the subject of these incorporated applications is known as DeltaSyn, as it is also known in the art: S. Krishnaswamy, et al., "DeltaSyn: An Efficient Logic-Difference Optimizer for ECO Synthesis," proc. ICCAD 2009. In the description of the instant method, when steps of DeltaSyn are referred to it will be done without further explanations, as it is understood that they are known in the art, and/or fully detailed in the incorporated applications.

Embodiments of this disclosure present a method for implementing desired logic changes in an original circuit, without having to do a full new design. Embodiments of the present disclosure, additionally to the two reduction phases of earlier approaches: the equivalence based reduction from the input side, and the matching based reduction from the output side, introduce a speculative reduction step in between these two phases. This speculative reduction step directly substitutes unmatched circuits in the original netlist with those of a specification (SPEC) netlist, which SPEC netlist is created by substituting changed original logic with the new logic at user defined hint signals. The instant disclosure makes use of the fact that in practice the logic changes can easily be located when comparing an ECO HDL file with the original HDL file. Such recognition can be used to guide a back substitution process, once a function correspondence is established between original HDL and the original netlist. For high performance circuits the presently disclosed approach may create a smaller patch size, or delta netlist, than previous procedures. The HDL files in embodiments of the instant application typically are VHDL files.

An engineering change order (ECO) deep in a design cycle maybe a common reason for having to implement logic changes into an essentially completed design. However, ECO may not be the only such reason, there maybe other causes. For instance, a subsequent generation of a design maybe quite similar to the older one, and would be desirable to avoid full redesign. Or, for instance, the function of two IC-s are physically merged onto the same chip, and to accommodate this, the IC-s need slightly modified logic. From the point of view of the embodiments of the present invention, it is immaterial what the origin for a modification is, whether it is an ECO, or something different. Any and all sources of logic change are within the capabilities of the disclosed methods. In the following descriptions the terms ECO and "new", for instance, ECO logic and new logic, are interchangeably used.

Definitions for, and discussions of, some additional terms used in the present disclosure are as follows. The "original logic" is the logic of the original IC, before the desired modifications are implemented. The original logic is prescribed in a original hardware description language (HDL) file, the "original HDL file". Often in the embodiments of the present disclosure the HDL understood to be VHDL, thus the term "original VHDL" may be used equivalently to original HDL file. But, this is not meant to be limiting. Further HDLs, for instance Verilog, and others, are included within the embodiments of the present invention. The "original netlist" is the circuit netlist of the original IC incorporating the original logic. The original netlist was synthesized from the original VHDL, which synthesis included beyond logic synthesis, physical synthesis, as well, such as various optimizations. The "new VHDL", or "ECO VHDL", or, in general, the "new/ECO HDL file", is the prescription for the ECO, or new, logic, to be implemented in place of the original logic. The "patch", or "delta netlist" is the output of the disclosed procedure. The delta netlist includes the gates to be inserted or rewired in the original netlist, resulting in the original netlist having the incorporated original logic changed into the new/ECO logic. For a given original and new VHDL, the smaller a delta netlist is produced the better, since that means less reworking for the IC in changing its logic.

FIG. 1 shows a flowchart for a representative embodiment of the disclosure. The inputs are the original netlist, the original HDL file, and the new HDL file. The output of the process is the delta netlist. In a typical embodiment the HDL is VHDL.

In a top level view, the flowchart in FIG. 1 displays three differences relative to delta netlist generators known in the art, such as, for instance, DeltaSyn. First, user hints are introduced to indicate which signals between the original VHDL and the ECO VHDL have been changed. Second, in the instant process flow the original netlist is compared against a generated model: the SPEC netlist, instead of the new/ECO netlist directly. The new, or ECO, netlist is a netlist which is obtained by logic synthesis from the new/ECO HDL. Third, the instant process includes a speculative reduction step between the equivalence based reduction and the matching based reduction steps.

User hints are generated by comparing the original HDL file and the new HDL file. For the purposes of this description a "hint" is defined as a signal which has changed, and it is different in the new HDL file compared to the original HDL file. In ECO, often the design changes can be narrowed down to a few changed signals in the HDL files. In a typical embodiment where the HDL files are VHDL files, finding a hint by a user is illustrated by the following example, comparing two lines in the VHDL. Original: rst<=ls_need AND ex_hit; ECO: rst<=core AND ls_need AND ex_hit. If the only difference between the original and ECO VHDLs is the rst signal, then rst is a hint for the follow up synthesis, to be marked by the user. Such hints can be recognized easily with some file comparison utilities such as xdiff of UNIX, for instance. If desired, the user may also rewrite both the original and ECO VHDL to define new signals which can narrow down the change better. For example, Original: bus(0 To 7)<=GATE_AND(select, in(0 To 7)); ECO: bus(0 To 11)<=GATE_AND(select AND dis, in(0 To 11)). Here GATE_AND is function to AND its first input signal, which is a single bit, with each bit of the second input vector. In this case, it although it may seem that the changed signal is bus(0 To 7), but these VHDLs can be modified to be: Original: bus(0 To 7)<=GATE_AND(select_new, in(0 To 7)); Select_new<=select; ECO: bus(0 To 11)<=GATE_AND(select_new, in(0 To 11)); Select_new<=select AND dis; The created select_new signal is a better hint than the previous bus(0 To 7) because it narrows down the change. The hint signals are marked in both the original HDL file and the new/ECO HDL file.

User hints may be generated automatically, as well. One can write a script to figure out the VHDL signal difference or embed such a function in a VHDL compiler. In practice, generally it is not difficult to perform manual user hints identification even on a large ECO. For user hints to significantly decrease the final delta netlist it is not required to find all of them. Hints that are most effective and desirable when they refer to changes near primary inputs, or to changes driving high fanout nets.

Continually referring to FIG. 1, both original HDL file and the new/ECO HDL file are synthesized by a logic synthesis tool. In this way two netlist are created. One from the original HDL file, which will be referred to as the "current netlist", and one from the new/ECO HDL file, which will be referred to as the "new netlist". During the logic synthesis the user hints which previously were marked on both the original and ECO HDL files, are purposefully preserved. Consequently they do exist in the logic synthesized current netlist and new netlist.

Continually referring to FIG. 1, the procedure finds functional correspondence between the original netlist and the current netlist. It is noted that the original netlist was produced by physical synthesis tools, thus it may be different from the current netlist which was synthesized from the original HDL file with logic synthesis only.

For illustrating how some of the steps in the instant procedure are being carried out in detail, the pseudocodes of the algorithms used for executing the procedures are presented in figures. Such pseudocodes are understood by those skilled in the art. Mostly the codes shown in the instant specification are given in $C^{++}$, since it a widely used and understood language. However this should not be interpreted as limitation. The choice of programming language is for illustration purposes only. It is known in the art that the same procedures, objects, or any other constructs, can be encoded in a variety of different languages. The embodiments of the presented method are not tied any particular programming language.

The algorithm presented in FIG. 2 may be used to find functional correspondence between the original netlist and the current netlist. In this algorithm "netlist A" is the original netlist, and "netlist B" is the netlist synthesized from the original HDL file, the current netlist. This algorithm uses simulation and SAT engine to perform equivalence checking, as known in the art. It is aimed to find as much equivalence between the two netlists as possible. Once an equivalent, or correspondent, pair of nets is found, it is recorded on the current netlist for later use speculative reduction.

A functional correspondence between two logic circuits, for instance, ckt_orig and ckt_eco, is a 2-tuple (S, S'), where S and S' are sets of signals $S=\{s_1, s_2, \ldots, s_n\}$, $S'=\{s_1', s_2', \ldots, s_n'\}$, from ckt_orig and ckt_eco respectively, such that signals in S from ckt_orig are functionally equivalent to those matching signals in S', i.e. s1 equivalent to s1', s2 equivalent to s2'. The individual signal pairs $(s_1, s_1'), (s_2, s_2') \ldots (s_n, s_n')$ are said to be correspondence pairs. For example, During functional correspondence step, one desires to find a maximum number of correspondence pairs between original HDL and original netlist.

Figure 3:
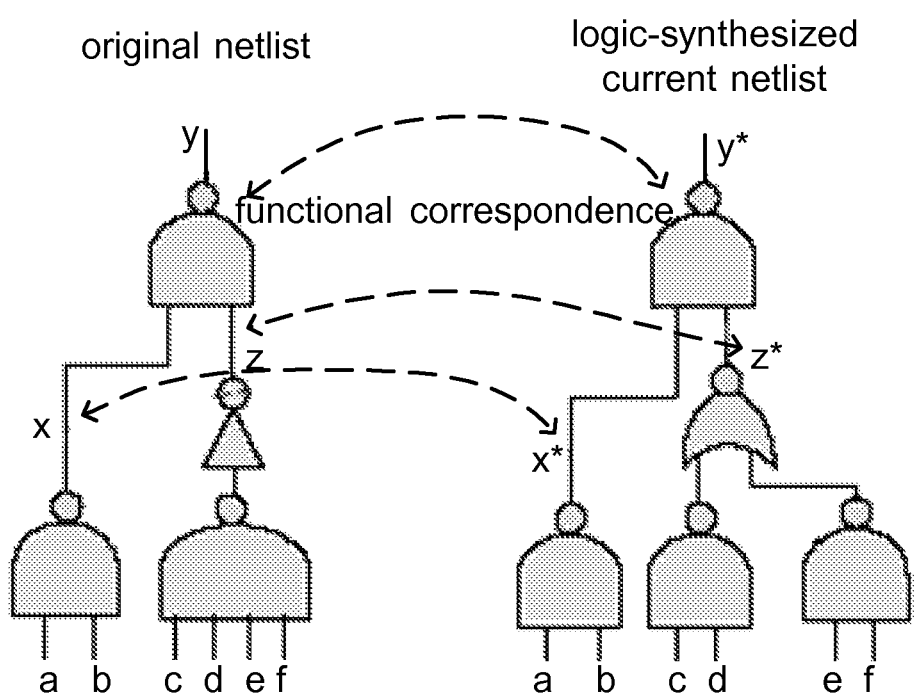
FIG. 3 shows an illustrative example for a step in an embodiments of the disclosure on finding functional correspondences.

FIG. 3 shows an example of functional correspondence, using simple nets. Symbols presented in FIGS. 3, 5, and 6, of the disclosure are the customary ones used in the art to depict functional elements of circuits. For instance, FIG. 3 depicts NAND and NOR gates, and an inverter. In FIG. 3, the set of signals $S=\{x,y,z\}$ and $S'=\{x^*,y^*,z^*\}$ form a functional correspondence, where $(x,x^*), (y,y^*), (z,z^*)$ are correspondence pairs.

Continually referring to FIG. 1, the procedure performs a back substitution with user hints. The back substitution takes two netlists as inputs: the new/ECO netlist and the current netlist. In this step hint nets in the current netlist are substituted with hint nets from the new netlist. Hint nets are those nets that pertain to a marked user hint. The result will be the specification (SPEC) netlist.

The algorithm presented in FIG. 4 may be used to perform the back substitution step. In this algorithm "netlist A" is the current netlist and "netlist B" is the new/ECO netlist. It substitutes those circuits producing hint nets in A with those in B. Because the hint net markings were preserved during logic synthesis, one can find the corresponding hint nets between A and B.

Figure 5:
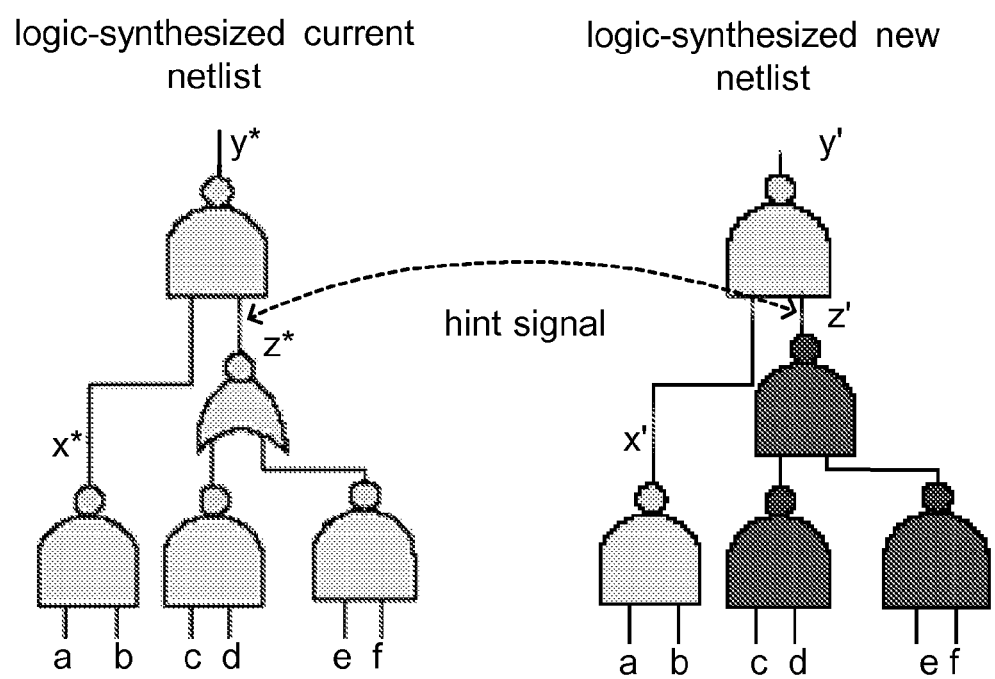
FIG. 5 shows an illustrative example for a step in an embodiments of the disclosure on applying a user hint for deriving a specification netlist.
Figure 6:
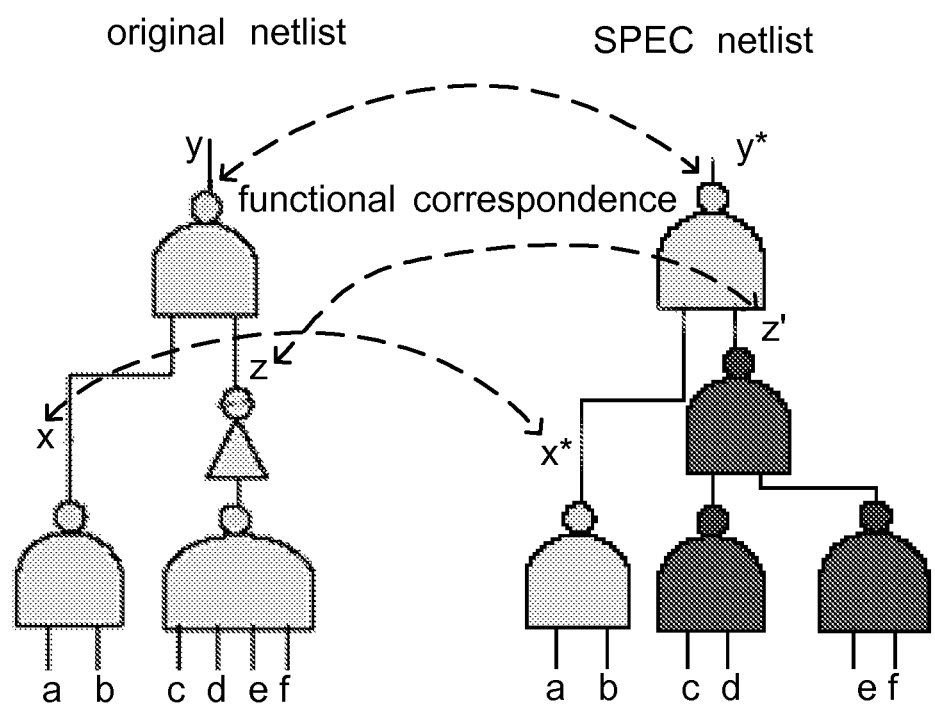
FIG. 6 shows an illustrative example for a step in an embodiments of the disclosure on speculative reduction based on functional correspondence.

An example of SPEC netlist generation is shown in FIGS. 5 and 6, again on the simple nets introduced in reference to FIG. 3. In FIG. 5, the logic synthesized current netlist and the logic synthesized new/ECO netlists are compared, and $z^*$ and $z'$ are the matching hint signals. The procedure back substitutes the circuits driving $z^*$ with circuits driving $z'$: the gates shown in dark shading. The result SPEC netlist is shown in FIG. 6. It may be noted that because the SPEC netlist is created on the current netlist, the recorded functional correspondence to the original netlist will still be there in SPEC netlist. This will be used later in the speculative reduction step.

After substitution, the SPEC netlist may be written out. The SPEC netlist will be functionally equivalent to the new HDL file, but, as noted, will also have functional correspondence information stored by the earlier functional correspondence step. At this point, again referring to FIG. 1 a verification step is performed on the SPEC netlist, to assure that indeed it is incorporating the logic prescribed by the new HDL file. Such verification may be done by using DeltaSyn. If the given hints are not complete, DeltaSyn will modify the SPEC netlist to ascertain it is functionally equivalent to new/ECO netlist. After the verification the SPEC netlist maybe referred to as the verified SPEC netlist.

Continually referring to FIG. 1, using the original netlist an equivalence based reduction is executed on the SPEC netlist. Such equivalence based reduction, as discussed earlier commences at the primary inputs of the nets, and it is a procedure known in the art. For instance, this step may be executed using DeltaSyn. After the equivalence-based reduction, all the equivalent circuit structures between the original netlist and the SPEC netlist have been identified and reduced from the SPEC netlist.

Continually referring to FIG. 1, the method continues with the correspondence based speculative reduction. The speculative reduction then uses the functional correspondence information in the SPEC netlist to speculatively reduce the patch, or delta netlist, size. By making use of the recorded functional correspondence on the SPEC netlist, the procedure substitutes a portion of the nets in the original netlist with a corresponding portion of the nets of the SPEC netlist.

The algorithm shown in FIG. 7 may be used to perform the correspondence based speculative reduction step. During the speculative reduction, any existing unmatched gate in the SPEC netlist will be processed topologically. The procedure will try to locate the recorded functionally corresponded signals in the original netlist and try to substitute the original circuit with the SPEC circuit if they are not equivalent. This step is speculative because one may not be sure if this substitution will reduce the final patch count. It is assumed that after speculative reduction more primary outputs will become equivalent, and therefore the matching based reduction which will follow, and which starts at the primary outputs, will not have to work on all the originally mismatched primary outputs. The substitution circuits will have a mark on them to be extracted into final delta netlist.

FIG. 6 is illustrating on the simple nets the two discussed reduction steps. The equivalence based reduction will identify x and $x^*$ as equivalent and therefore remove the gate driving $x^*$ in the SPEC netlist. Nets $y^*$ and $z'$ are still not matched because their functions changed. Speculative reduction will work on the remaining of the SPEC gates from inputs to outputs. It will first find the functional correspondence between $z'$ and z, and check whether they are equivalent. Since they are not, it will connect $z'$ to the sinks of z and mark the three gates driving $z'$, shown in dark shading, as delta. Then, the procedure will go on to check $y^*$, since z has been replaced by $z'$, y is now equivalent to $y^*$, consequently it does nothing. And, the following matching based reduction step on y and $y^*$ will consider both cones are equivalent, and do not perform any reconnection. In the end, only the three gates driving $z'$ will be extracted into delta netlist, or patch.

It is worth to note that even if the original netlist is restructured in such a way that there is no direct functional correspondence between the hint signal and the original netlist, the speculative reduction algorithm will still help reduce patch size by continue substituting functionally corresponded signals on the fanout cones of hint signals in the topological order. For the example, in FIG. 6 if there is no functional correspondence between z and $z'$, one may still find functional correspondence on y and $y^*$, therefore y will be replaced by $y^*$, and the signals driven by y will be equivalent as well.

Continually referring to FIG. 1, following the speculative reduction, a matching based reduction is executed on the SPEC netlist. Such matching based reduction, as discussed earlier, commences at the primary outputs of the nets, and it is a procedure known in the art. For instance, this step may be executed using DeltaSyn. After the matching based reduction, the SPEC netlist would be reduced to the final delta netlist, which is the result of the procedure. Since, the delta netlist is the one needed to execute the logic change on the original netlist. In practice there is an extraction procedure to extract the gates not belonging to the original netlist, and the wires that connect differently to original netlist, into the delta netlist.

Applications of the instant method for ECO on representative ICs often resulted in a delta netlist reduction of over 80% compared with earlier approaches, for instance, with DeltaSyn.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

Many modifications and variations of the present invention are possible in light of the above teachings, and could be apparent for those skilled in the art. The scope of the invention is defined by the appended claims.

The invention claimed is:

1. A method, comprising:
   accepting an original hardware description language (HDL) file prescribing an original logic;
   accepting an original netlist incorporating said original logic, wherein said original netlist has nets;
   accepting a new HDL file prescribing a new logic, wherein said new logic comprises a logic change relative to said original logic, wherein said original HDL file and said new HDL file both comprise signals;
adding a user hint to both said original HDL file and said new HDL file when one of said signals is different between said new HDL file and said original HDL file;
creating a current netlist from said original HDL file by using logic synthesis;
creating a new netlist from said new HDL file by using logic synthesis, and transferring said user hint into both said current netlist and said new netlist;
wherein said current netlist and said new netlist both comprise nets, substituting hint nets in said current netlist with hint nets from said new netlist, wherein hint nets are those of said nets that pertain to said user hint, whereby said current netlist is turned into a specification (SPEC) netlist incorporating said new logic;
using said original netlist for executing an equivalence based reduction on said SPEC netlist to generate a delta netlist by:
finding a functional correspondence between said original netlist and said current netlist; and recording said functional correspondence on said current netlist;
by making use of said recorded functional correspondence on said SPEC netlist, substituting a portion of said nets in said original netlist with a corresponding portion of said nets of said SPEC netlist; and
synthesizing said delta netlist using a computer, and inserting said delta netlist into said original netlist, whereupon said original netlist is incorporating said new logic.

2. The method of claim 1, wherein said method further comprises:
ensuring that said SPEC netlist incorporates said new logic.

3. The method of claim 1, wherein said method further comprises:
following said substitution in said original netlist, using said original netlist for executing a matching based reduction on said SPEC netlist, whereupon said SPEC netlist becomes said delta netlist.

4. The method of claim 1, wherein said method further comprises:
selecting both said original HDL file and said new HDL file to be VHDL files.

5. A computer program product comprising a non-transitory computer readable storage medium having a computer readable program code embodied therewith, wherein said computer readable program code when executed on a computer causes said computer to:
enter an original hardware description language (HDL) file prescribing an original logic;
enter an original netlist incorporating said original logic, wherein said original netlist has nets;
enter a new HDL file prescribing a new logic, wherein said new logic comprises a logic change relative to said original logic, wherein said original HDL file and said new HDL file both comprise signals;
add a user hint to both said original HDL file and said new HDL file when one of said signals is different between said new HDL file and said original HDL file;
create a current netlist from said original HDL file by using logic synthesis;
create a new netlist from said new HDL file by using logic synthesis, and transfer said user hint into both said current netlist and said new netlist;
wherein said current netlist and said new netlist both comprise nets, substitute hint nets in said current netlist with hint nets from said new netlist, wherein hint nets are those of said nets that pertain to said user hint, whereby said current netlist is turned into a specification (SPEC) netlist incorporating said new logic;
use said original netlist to execute an equivalence based reduction on said SPEC netlist to generate a delta netlist by:
finding a functional correspondence between said original netlist and said current netlist; and recording said functional correspondence on said current netlist;
by making use of said recorded functional correspondence on said SPEC netlist, substituting a portion of said nets in said original netlist with a corresponding portion of said nets of said SPEC netlist; and
synthesize said delta netlist using a computer, and inserting said delta netlist into said original netlist, whereupon said original netlist is incorporating said new logic.

6. The computer program product of claim 5, wherein said computer readable program code further causes said computer to:
ensure that said SPEC netlist incorporates said new logic.

7. The computer program product of claim 5, wherein said computer readable program code further causes said computer to:
following said substitution in said original netlist, use said original netlist to execute a matching based reduction on said SPEC netlist, whereupon said SPEC netlist becomes said delta netlist.

* * * * *